(12) United States Patent
Lee et al.

(10) Patent No.: US 6,194,947 B1
(45) Date of Patent: Feb. 27, 2001

(54) VCO-MIXER STRUCTURE

(75) Inventors: Kyeongho Lee; Deog-Kyoon Jeong, both of Seoul (KR)

(73) Assignee: Global Communication Technology Inc., Santa Clara, CA (US)

( * ) Notice: Subject to any disclaimer, the term of this patent is extended or adjusted under 35 U.S.C. 154(b) by 0 days.

(21) Appl. No.: 09/121,863

(22) Filed: Jul. 24, 1998

(51) Int. Cl.[7] .................................................... G06F 7/44
(52) U.S. Cl. ........................ 327/359; 327/355; 327/356; 327/113; 455/333
(58) Field of Search .................................. 327/113, 116, 327/359, 357; 455/326, 333

(56) References Cited

U.S. PATENT DOCUMENTS

| | | | |
|---|---|---|---|
| 5,418,815 | * | 5/1995 | Ishikawa et al. ........................ 375/5 |
| 5,438,591 | * | 8/1995 | Oie et al. ............................... 375/261 |
| 5,448,772 | * | 9/1995 | Grandfield ............................. 327/357 |
| 5,734,970 | * | 3/1998 | Saito ...................................... 455/76 |
| 5,794,119 | * | 8/1998 | Evans et al. ........................... 455/71 |

* cited by examiner

Primary Examiner—Dinh T. Le
(74) Attorney, Agent, or Firm—Fleshner & Kim, LLP

(57) ABSTRACT

A VCO-mixer structure in accordance with the present invention includes a multi-phase VCO and a multi-phase mixer. The VCO includes a plurality of differential delay cells and the mixer includes a differential amplifying circuit and a combining circuit. The differential amplifying circuit of the multi-phase mixer includes two load resistors coupled to two differential amplifiers, respectively. The combining circuit includes bias transistors, first combining unit and second combining unit coupled to the bias transistors, respectively, and a current source coupled to the first and second combining units. The first combining unit includes a plurality of transistor units, and the second combining unit includes a second plurality of transistor units. Preferably, each of the plurality of transistor units includes a plurality of serially connected transistors, wherein the serially connected transistors are coupled in parallel with the serially connected transistors of the plurality of transistor units.

20 Claims, 5 Drawing Sheets

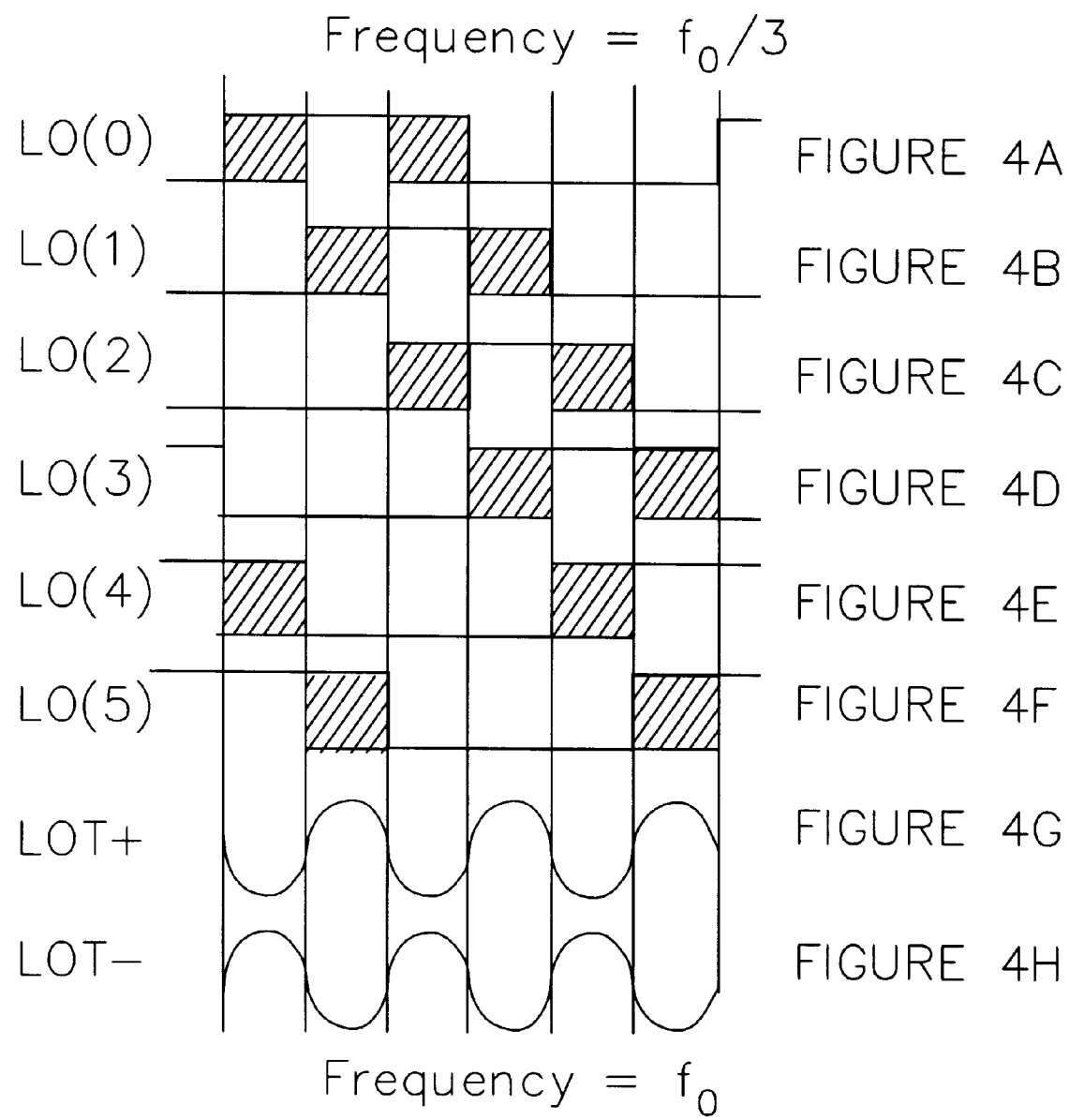

VCO-MIXER STRUCTURE

BACKGROUND OF THE INVENTION

1. Field of the Invention

The present invention relates to voltage controlled oscillator (VCO) and mixer, and more particularly, to multi-phase VCO and mixer.

2. Background of the Related Art

Presently, a radio frequency (RF) communications system has a variety of applications including PCS communication and IMT systems. As such, a CMOS chip integration of the system has been pursued to reduce the cost, size and power consumption.

Generally, the RF communication system is composed of RF front-end block and base-band digital signal processing (DSP) block. Currently, the base-band DSP block can be implemented with low cost and low power CMOS technology. However, the RF front-end cannot be implemented by CMOS technology due to fundamental limits in speed and noise characteristics, which are below the speed and noise specification of popular RF communication systems.

For example, the PCS hand-phone system operate at a frequency over 2.0 GHz, but current CMOS technology can support reliably operation only up to a frequency of 1.0 GHz in terms of speed and noise. Hence, the RF front-end block is implemented using bipolar or bi-CMOS technology that has better speed and noise characteristics than CMOS technology, but is more expensive and consumes more power.

One of the main causes for the 1 GHz limitation is the structure of the VCO and the mixer. FIG. 1 is a circuit diagram of the VCO-mixer according to a background art. As shown in FIG. 1, the VCO 10 includes four differential delay cells 12, 14, 16 and 18 and has a structure similar to a ring oscillator. The four delay cells 12–18 are serially connected and generate a clock signal LO+ and an inverted clock signal LO−, each having a frequency of $f_o$. A control circuit for the VCO 10 that generates a frequency control signal includes a phase frequency detector 4, a charge pump 6 and a loop filter 8 that outputs the frequency control signal to each of the delay cells 12–18. The phase frequency detector 4 receives a reference clock signal $f_{ref}$ and a VCO clock signal $f_{VCO}$ from a reference clock divider circuit 2 and a VCO clock divider circuit 3, respectively. The frequency $f_o$ of the clock signals LO+ and LO− is represented by M/K ($f_{ref}$)=$f_o$. Thus, the frequency $f_o$ is based on the reference clock signal $f_{ref}$ and the divider circuits 2 and 3.

The mixer 20, such as Gilbert - Multiplier, multiplies the input signals, such as radio frequency (RF) signals RF+ and RF−, with the clock signals LO+ and LO−. The mixer 20 includes two load resistors R1 and R2 coupled to a source voltage $V_{DD}$, eight NMOS transistors 21–28, and a current source $I_{S1}$. The gates of the NMOS transistors 21 and 22 are coupled to receive the clock signal LO+, and the gates of the NMOS transistors 23 and 24 are coupled to receive the inverted clock signal LO−. The gates of the NMOS transistors 25 and 26 receive a common bias voltage $V_{Bias}$. The gates of the NMOS transistors 27 and 28 receive the RF signals RF+ and RF−, respectively. Therefore, the clock signals LO+ and LO− are multiplied with the RF signals RF+ and RF− only when the transistors 25 and 27 or the transistors 26 and 28 are turned on together. The output signals OUT+ and OUT− of the mixer 20 has a frequency lower than its original frequency by the frequency $f_o$ of the clock signals LO+, LO−.

As discussed above, a wide frequency range and a low phase noise are desirable for various applications. However, the VCO-mixer structure 10 and 20 can only support up to a frequency 1 GHz with reliable phase noise and frequency range. The performance of the VCO-mixer structure 10 and 20 becomes worse in terms of phase noise and frequency range and is unacceptable as the frequency of the clock signals LO+ and LO− from the VCO increases. Hence, the VCO 10 and the mixer 20 cannot be readily implemented when the frequency $f_o$ of the clock signals LO+ and LO− is over 1 GHz.

SUMMARY OF THE INVENTION

An object of the present invention is to at least substantially obviate problems and disadvantages of the related art.

A further object of the present invention is to fabricate a VCO-mixer on a single substrate.

Another object of the present invention is to increase the frequency range of a VCO-mixer structure.

Still another object of the present invention is to reduce the noise of a VCO-mixture structure.

Another object of the present invention is to increase a performance of the VCO-mixer structure.

To achieve the advantages and in accordance with the purpose of the present invention, as embodied and broadly described, the structure of the invention comprises a clock generator for generating multi-phase clock signals having a first frequency lower than an original frequency, and a mixer for producing at least sequence of clock signals having the original frequency using the multi-phase clock signals and then multiplying the at least one sequence of clock signals with received RF signals.

In another aspect of the present invention, a method of operating a CMOS which has a clock generator and a mixer comprises the steps of generating multi-phase clock signals having a first frequency lower than an original frequency through the clock generator, producing at least one sequence of clock signals having the original frequency by combining the multi-phase clock signals, and multiplying the at least one sequence of clock signals with RF signals received to the CMOS through the mixer.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIGS. 4A–4H are operational timing diagrams of FIG. 3.

DETAILED DESCRIPTION OF PREFERRED EMBODIMENTS

Figure 1:
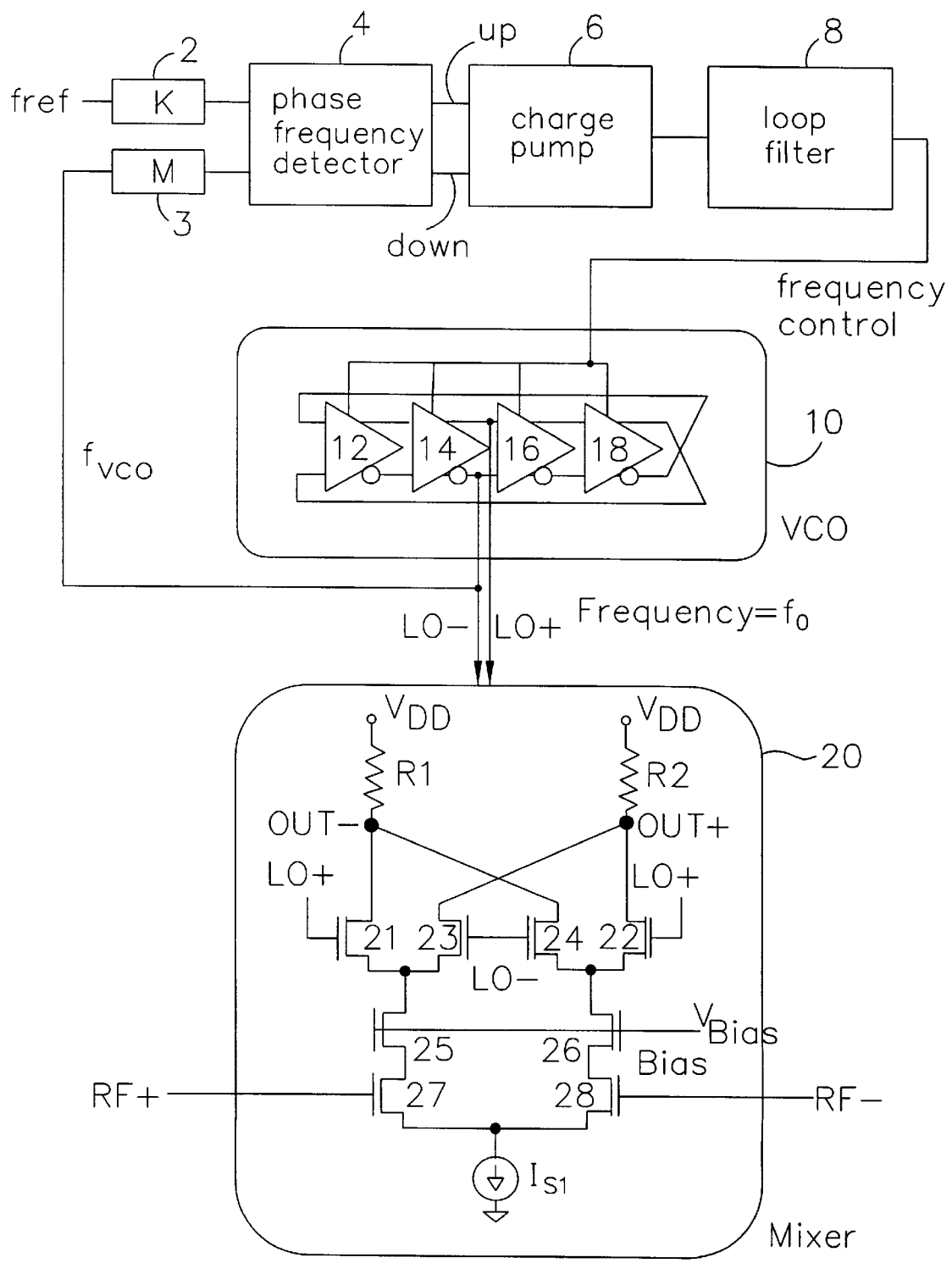
FIG. 1 is a circuit diagram of a VCO-mixer structure according to a background art.
Figure 2A:
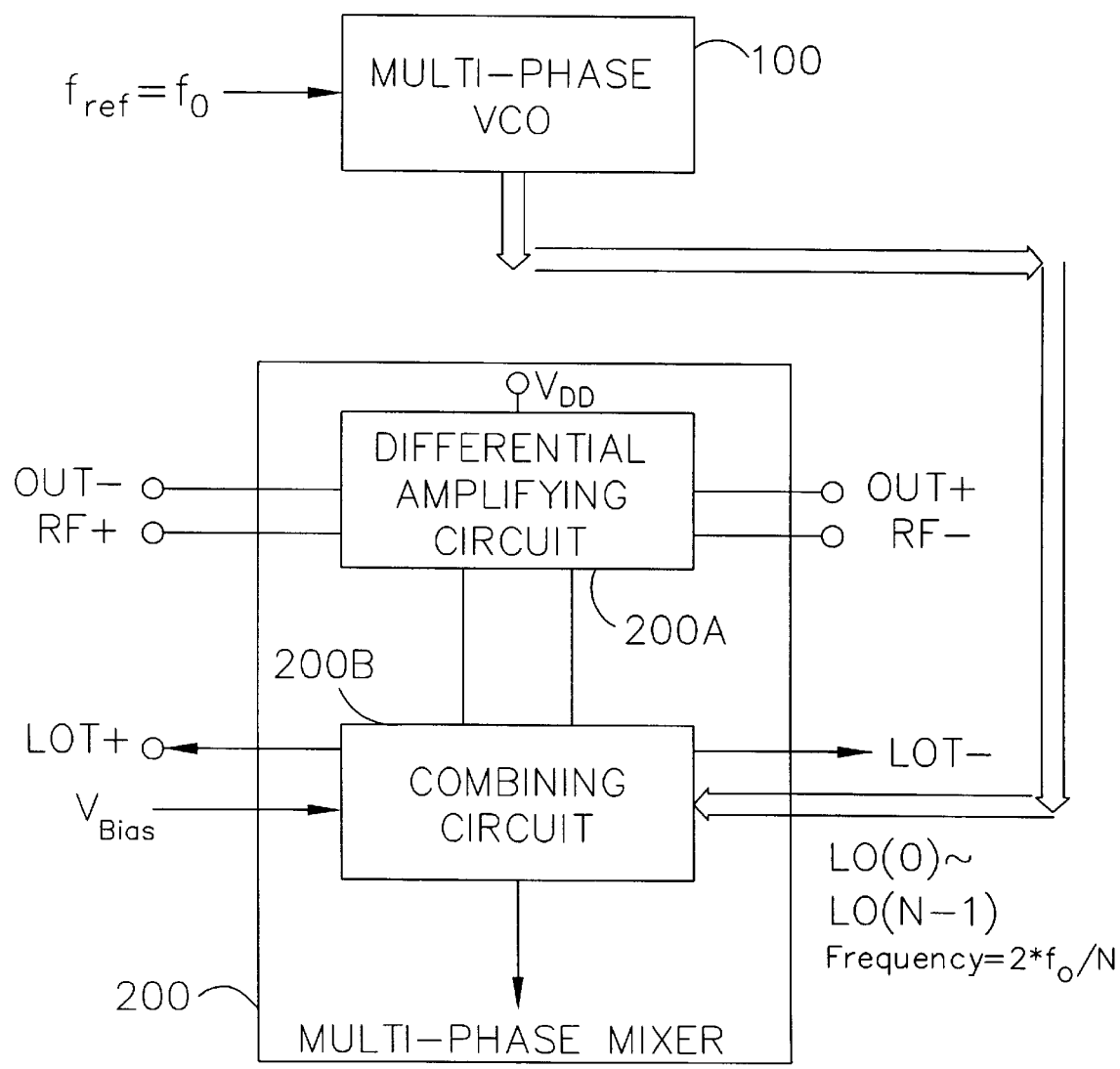
FIG. 2A is a block diagram of a VCO-mixer structure according to a first preferred embodiment of the present invention.

FIG. 2A is a block diagram of a VCO-mixer structure in accordance with a first preferred embodiment of the present invention. The structure comprises a multi-phase voltage controlled oscillator VCO 100 and a multi-phase mixer 200. The multi-phase mixer 200 includes a differential amplifying circuit 200A and a combining circuit 200B.

When a reference clock signal having a reference frequency of $f_{REF}=f_o$ is used, the multi-phase VCO 100 generates a plurality of N-phase clock signals LO(i=0 to N−1) having a frequency of $2*f_o/N$, where $N=N_D*2$ and $N_D$ equals the number of delay cells in the multi-phase VCO 100. In other words, the VCO 100 reduces the frequency $f_o$ to $2*f_o/N$. The frequency $2*f_o/N$ reduces the phase noise of the multi-phase VCO and increases the frequency range.

The plurality of N-phase intermediate clock signals LO(0), LO(1), . . . , LO(N−1) having a frequency of $2*f_o/N$ is inputted into the combining circuit 200B of the multi-phase mixer 200, and the input signals, for example, RF signals RF+ and RF− are inputted into the differential amplifying circuit 200A. The differential amplifying circuit 200A differentially amplifies the radio frequency signals RF+ and RF−. The combining circuit 200B is responsive to a bias voltage $V_{Bias}$ and combines the N-phase intermediate clock signals LO(0)–LO(N−1) to generate the output clock signals LOT+ and LOT− having the original frequency $f_o$. The mixer 200 then accomplishes a multiplication of the output clock signals LOT+ and LOT− and the RF signals RF+ and RF−.

Figure 2B:
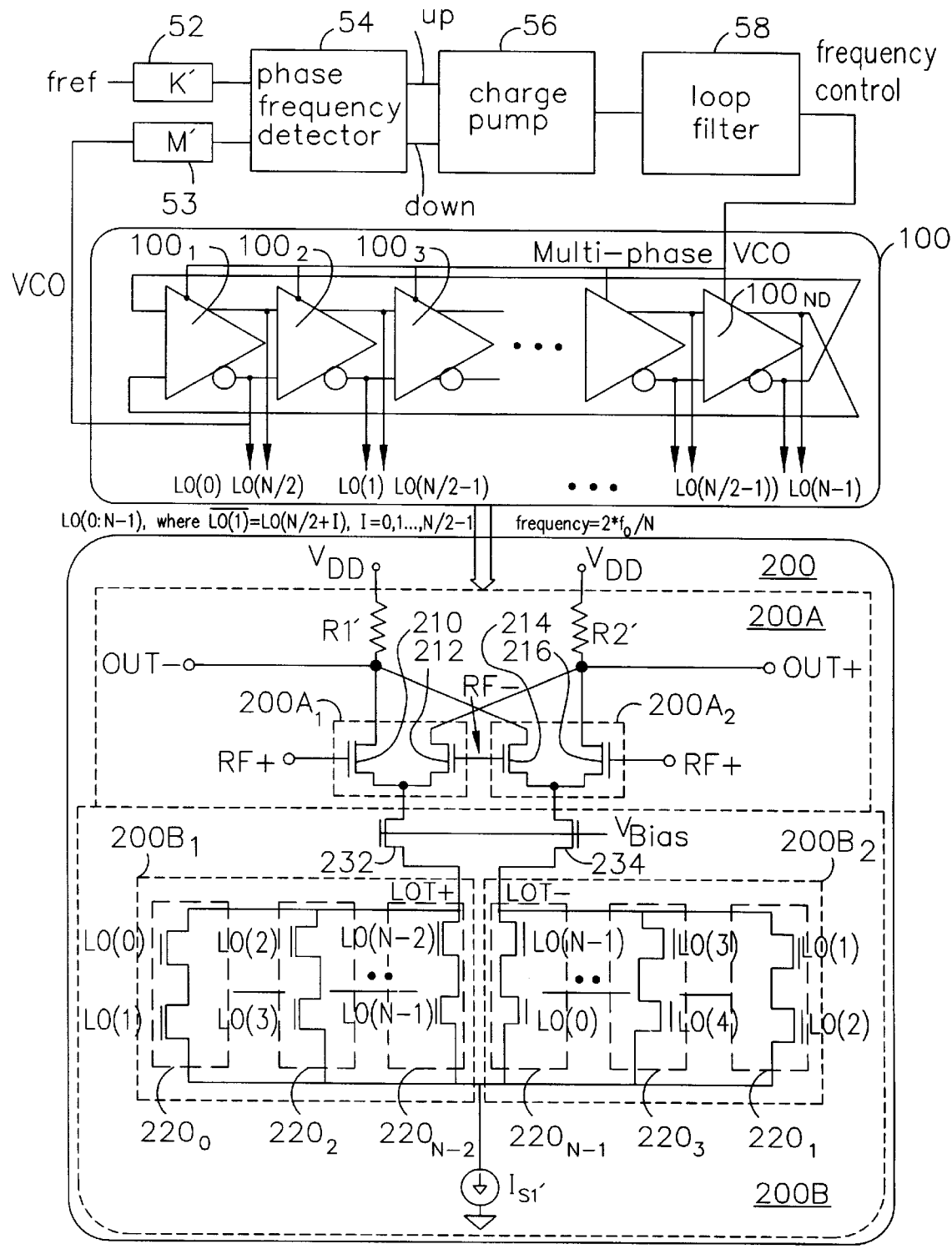
FIG. 2B is a circuit diagram of a VCO-mixer structure of FIG. 2A.

FIG. 2B illustrates a circuit diagram of the VCO-mixer structure 100, 200 in accordance with a first preferred embodiment. The multi-phase VCO 100 includes $N_D$ number of delay cells $100_1$–$100_{ND}$ coupled in series. Based on such configuration, the multi-phase VCO generates a plurality of N-phase intermediate clock signals LO(0)–LO(N−1) having a frequency of $2*f_o/N$. A control circuit for the VCO 100 that generates a frequency control signal includes a phase frequency detector 54, a charge pump 56 and a loop filter 58 that outputs the frequency control signal to each of the delay cells $100_1$–$100_{ND}$. The phase frequency detector 54 receives a reference clock signal $f_{ref}$ and a VCO clock signal $f_{VCO}$ from a reference clock divider circuit 52 and a VCO clock divider circuit 53, respectively. The frequency $2f_o/N$ of the clock signals LO(φ)–LO(N−1) is represented by $M'/K'(f_{ref})=2f_o/N$. Thus, the frequency $f_o$ is based on the reference clock signal $f_{ref}$ and the divider circuits 52 and 53. In other words, $f_{VCO}$ can be $2f_o/N$ by setting M'/K' of the divider circuits 52 and 53.

The differential amplifying circuit 200A of the multi-phase mixer 200 includes two load resistors R1' and R2' coupled to two differential amplifiers $200A_1$ and $200A_2$, respectively. The differential amplifier $200A_1$ includes two NMOS transistors 210 and 212, and the differential amplifier $200A_2$ includes two NMOS transistors 214 and 216. The drains of the NMOS transistor 210 and 216 are coupled to the load resistors R1' and R2', respectively, and the gates of the NMOS transistors 210 and 216 are coupled for receiving the RF signal RF+. Further, the drains of the NMOS transistors 212 and 214 are coupled to the load resistors R2' and R1', respectively, and the gates are coupled for receiving the RF signal RF−. The sources of NMOS transistors 210 and 212 and NMOS transistors 214 and 216 are coupled to each other and to the combining circuit 200B of the multi-phase mixer.

The differential amplifiers $200A_1$ and $200A_2$ differentially amplifies the RF signals RF+ and RF−, respectively, such that a more accurate output signals OUT− and OUT+ can be obtained. Further, the differential amplification removes noise that may have been added to the RF signals RF+ and RF−. In this preferred embodiment, two differential amplifiers $200A_1$ and $200A_2$ are included, however, the present invention may be also accomplished using only one of the differential amplifiers in alternative embodiments.

The combining circuit 200B includes bias NMOS transistors 232 and 234, first combining unit $200B_1$ and second combining unit $200B_2$ coupled to the bias NMOS transistors 232 and 234, respectively, and a current source $I_{s1}$ coupled to the first and second combining units $200B_1$ and $200B_2$. The first combining unit $200B_1$ includes a plurality of transistor units $220_0$, $220_2$ . . . $220_{N-2}$, and the second combining unit $200B_2$ includes a second plurality of transistor units $220_1$, $220_3$ . . . $220_{N-1}$.

Preferably, each of the plurality of transistor units includes a plurality of serially connected transistors, wherein the serially connected transistors are coupled in parallel with the serially connected transistors of the plurality of transistor units. Preferably, each transistor unit includes two (2) serially connected transistors. Hence, in the preferred embodiment, there are a total of N/2 number of transistor units in each combining unit $200B_1$ or $200B_2$, such that the total number of NMOS transistors is $2*N$.

The gate of the bias NMOS transistors 232 and 234 are coupled for receiving the bias voltage $V_{Bias}$, and the gates of the transistors in the first and second plurality of transistor units are coupled for receiving a corresponding N-phase intermediate clock signals LO(i) and /LO(i) having a frequency of $2*f_o/N$, where /LO(i)=LO(N/2+i), i=0, 1 . . . , N/2−1. In this preferred embodiment, the bias NMOS transistors 232 and 234 are included for prevention of error, however, such transistors may be omitted in alternative embodiments. Further, the sequential ON-OFF operation of the $2*N$ number NMOS transistors of the combining circuit 200B is equivalent to a NAND logic circuit, which can be interchanged with other equivalent logic circuits and structure in alternative embodiments.

The generic FIG. 2B structure allows integration of the multi-phase VCO 100 and multi-phase mixer 200 on a single chip, i.e., on a single semiconductor substrate using CMOS technology. Such structure and layout reduce noise including noise caused by parasitic capacitances. As described above, the differential amplification using the RF signals RF+ and RF− in the differential amplifying circuit 200A reduces noise.

The reduction of the reference frequency $f_o$ to N-phase intermediate clock signals LO(i) having a frequency of $2*f_o/N$ also reduces noise. When a plurality of transistors are formed on the same substrate, such as a semiconductor substrate for CMOS technology, a plurality of P-N junctions are formed in the substrate. The parasitic capacitances mostly exist at the P-N junctions. If the frequency of a signal applied to the gate of the transistor is very high, the higher frequency of $f_o$ causes much more noise compared to a reduced frequency of $2*f_o/N$.

Further, the operation of the differential amplifier circuit 200A and the combining circuit 200B is dependent on the output clock signals LOT+ and LOT− having a frequency of $f_o$, which are provided by the first combining unit $200B_1$ and second combining unit $200B_2$, respectively, by combining the N-phase intermediate clock signals LO(i) having a frequency of $2*f_o/N$. When the bias voltage $V_{Bias}$ is applied, the NMOS transistors 232 and 234 are turned ON and OFF based on the output clock signals LOT+ and LOT−.

Although the NMOS transistors 210, 212, 214 and 216 are turned ON by the RF signals RF+ and RF− applied to the gate electrodes, the amplification of the RF signals RF+ and RF− and the output clock signals LOT+ and LOT− for generating the output signals OUT+ and OUT− is performed when the bias NMOS transistors 232 and 234 are turned on by the clock signals LOT+ and LOT−.

Figure 3:
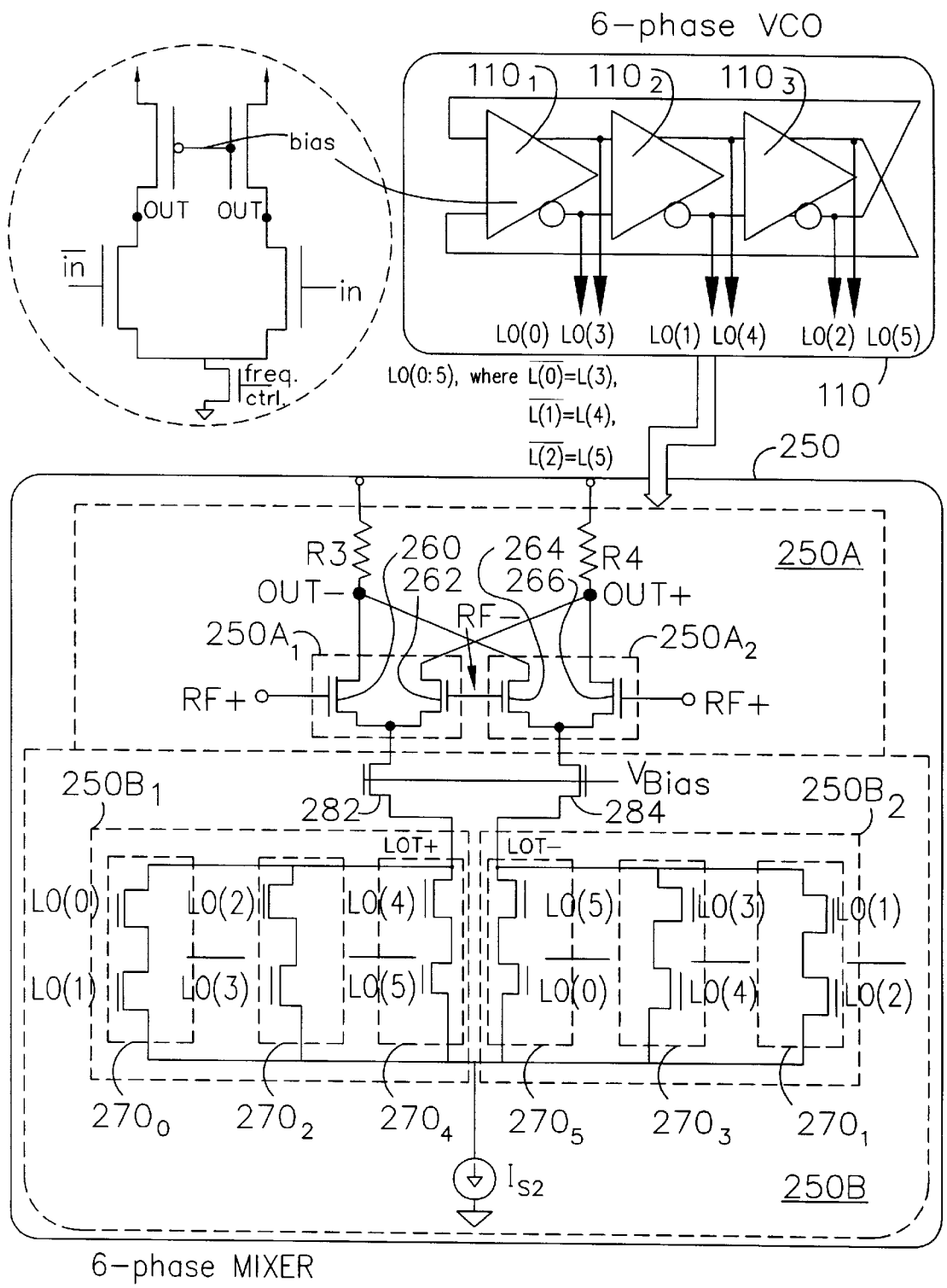
FIG. 3 is a circuit diagram of the VCO-mixer according to a second preferred embodiment of the present invention.

FIG. 3 illustrates a second preferred embodiment of the multi-phase VCO and the multi-phase mixer when $N_D=3$ and N=6, and FIGS. 4A–4H illustrate the operational timing diagrams of the FIG. 3 preferred embodiment. As shown, the multi-phase VCO 110 includes three delay cells $110_1$–$110_3$ to generate 6-phase intermediate clock signals LO(0)–LO (5). An exemplary circuit including five transistors for the delay cells $110_1$–$110_3$ (i.e., the delay cell $110_1$) is also shown. For illustrative purposes only, if the input clock signal has a frequency of $f_o=1.5$ GHz, the 6-phase intermediate clock signals LO(0)–LO(5) will have a frequency of 0.5 GHz.

The 6-phase mixer 250 includes a differential amplifying circuit 250A and a combining circuit 250B. The differential amplifying circuit 250A includes a first differential amplifier $250A_1$ having NMOS transistors 260 and 262 and a second differential amplifier $250A_2$ having NMOS transistors 264 and 266, which are coupled to load resistors R3 and R4, respectively. The combining circuit 250B includes a first combining unit $250B_1$ and $250B_2$, which are commonly coupled to a current source $I_{S2}$. The first and second combining units $250B_1$ and $250B_2$ are coupled to the first and second differential amplifiers $250A_1$ and $250A_2$ through bias NMOS transistors 282 and 284, respectively, which are biased by a bias voltage $V_{Bias}$. Cumulatively, the first and second combining units $250B_1$ and $250B_2$ includes six transistor units $270_0$–$270_5$ with a total of twelve transistors.

As shown in FIGS. 4A–4F, the 6-phase VCO 110 generates 6-phase intermediate clock signals LO(1)–LO(5) having the reduced frequency $f_o/3$. The 6-phase mixer 250 receives the 6-phase intermediate clock signals LO(1)–LO (5) and the RF signals RF+ and RF−. Each intermediate clock signal LO(1)–LO(5) and /LO(0)–/LO(2), where /LO (0)=LO(3), /LO(1)=LO(4) and /LO(2)=LO(5), is applied to a corresponding transistor of the first and second combining units $250B_1$ and $250B_2$. The first and second combining units $250B_1$ and $250B_2$ combine the 6-phase intermediate clock signals LO(0), LO(1), . . . LO(4), LO(5) having the frequency $f_o/3$ to generate the output clock signals LOT+ and LOT− having the frequency $f_o$.

As shown in FIGS. 4A–4H, when LO(0) is high and LO(1) is low (LO(4)=high), the two output signals LOT+ and LOT− are low and high, respectively. When LO(1) is high and LO(2) is low (LO(5)=high), the output signals LOT+, LOT− are high and low, respectively. When LO(2) is high and LO(3) is low (LO(0)=high), the output signals LOT+ and LOT− are low and high, respectively. When LO(3) is high and LO(4) is low (LO(1)=high), the output signals LOT+ and LOT− are high and low, respectively. When LO(4) is high and LO(5) is low (LO(2)=high), the output signals LOT+ and LOT− of the mixer 250 are low and high, respectively. When LO(5) is high and LO(0) is low (LO(3)=high), the output signals LOT+ and LOT− are high and low, respectively.

Each pair of NMOS transistors in the combining circuit are turned on in order, thereby producing the output signals LOT+ and LOT−, as shown in FIGS. 4G and 4H.

The preferred embodiments and modification thereof allow robust and low noise VCO and mixer to be fabricated on a single substrate, preferably on a semiconductor substrate using CMOS technology. The interference caused by the input signal and the input clock signal is drastically reduced because the frequency of the intermediate clock signals deviate from the modulation frequency. A phase locked loop (PLL) frequency range can be increased because the PLL frequency range can be easily increased on the low-center frequency condition. Moreover, such results can enhance the channel selection capability of RF front-end in a RF communication system.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A circuit comprising:
   a clock generator receiving a reference signal having a reference frequency that generates a plurality of first clock signals having different phases, each first clock signal having a first frequency which is less than said reference frequency; and
   a mixer coupled to said clock generator for receiving the plurality of first clock signals to generate a plurality of local oscillator signals therein having a higher second frequency, wherein said mixer multiplies the plurality of local oscillator signals with input signals to provide output signals at output terminals.

2. The circuit of claim 1, wherein said clock generator includes a plurality of delay cells coupled in series for providing the plurality of first clock signals having different phases.

3. The circuit of claim 1, wherein said mixer includes:
   a differential amplifying circuit for receiving the input signals and providing the output signals; and
   a combining circuit coupled to the differential amplifying circuit for receiving the plurality of first clock signals from said clock generator and outputting the local oscillator signals.

4. The circuit of claim 3, wherein said differential amplifying circuit includes:
   a first load resistor coupled for receiving a first potential; and
   a first differential amplifier coupled to said first load resistor and the combining circuit.

5. The circuit of claim 4, wherein said differential amplifying circuit further comprises:
   a second load resistor coupled for receiving the first potential; and
   a second differential amplifier coupled to said second load resistor and the combining circuit.

6. The circuit of claim 3, wherein said combining circuit comprises:
   a first combining unit for receiving corresponding first clock signals and coupled to said differential amplifying circuit to output a corresponding first local oscillator signal;
   a second combining unit for receiving corresponding first clock signals and coupled to said differential amplifying circuit to output a corresponding second local oscillator signal; and a current source coupled to said first and second combining units and coupled for receiving a second potential.

7. The circuit of claim 6, wherein the combining circuit further comprises first and second bias transistors respectively coupled between said first and second combining units and the differential amplifying circuit.

8. The circuit of claim 6, wherein each of said first and second combining units comprises a plurality of transistor units coupled to each other in parallel.

9. The circuit of claim 8, wherein each of said plurality of transistor units comprises a plurality of transistors coupled in series.

10. The circuit of claim 3, wherein the combining circuit combines the plurality of first clock signals to generate the plurality of local oscillator signals having the second frequency substantially the same as the reference frequency and, wherein the input signals have the reference frequency and the output signals are baseband.

11. The circuit of claim 10, wherein the combining circuit includes a plurality of transistor units coupled to each other in parallel, each transistor unit receiving at least one of the plurality of first clock signals as a respective control signal.

12. The circuit of claim 11, wherein each of the plurality of transistor units coupled in parallel includes a plurality of transistors coupled in series.

13. The circuit of claim 12, wherein each of the plurality of transistors receives a different one of the plurality of first clock signals as its respective control signals.

14. A circuit comprising:
a clock generator receiving a reference signal having a reference frequency that generates a plurality of first clock signals having N different phases, N being an integer greater than one, each first clock signal having a first frequency substantially equal to double a second frequency divided by N; and
a mixer coupled to the clock generator, that receives the plurality of first clock signals to generate at least one local oscillator signal therein having the second frequency, wherein the mixer multiplies the at least one local oscillator signal with input signals to provide output signals at output terminals.

15. The circuit of claim 14, wherein said mixer includes:
a differential amplifying circuit for receiving the input signals, said at least one local oscillator signal and providing the output signals; and
a combining circuit coupled to the differential amplifying circuit for receiving the plurality of first clock signals from said clock generator.

16. The circuit of claim 15, wherein the combining circuit combines the plurality of first clock signals to generate the at least one local oscillator signal having the second frequency greater than 1 GHz.

17. The circuit of claim 16, wherein the combining circuit includes a plurality of transistor units coupled to each other in parallel, each transistor unit receiving at least one of the plurality of first clock signals as a respective control signal.

18. The circuit of claim 17, wherein each of the plurality of transistor units coupled in parallel includes a plurality of transistors coupled in series.

19. The circuit of claim 18, wherein each of the plurality of transistors receives a corresponding one of the plurality of first clock signals as its respective control signals.

20. The circuit of claim 15, wherein said combining circuit comprises:
a first combining unit for receiving corresponding first clock signals and coupled to said differential amplifying circuit to output a corresponding first local oscillator signal;
a second combining unit for receiving corresponding first clock signals and coupled to said differential amplifying circuit to output a corresponding second local oscillator signal; and
a current source coupled to said first and second combining units and coupled for receiving a second potential, wherein the input signals have the reference frequency and the output signals are baseband.

* * * * *